(12) United States Patent
Shen et al.

(10) Patent No.: US 8,050,525 B2
(45) Date of Patent: Nov. 1, 2011

(54) METHOD AND SYSTEM FOR GRATING TAPS FOR MONITORING A DWDM TRANSMITTER ARRAY INTEGRATED ON A PLC PLATFORM

(75) Inventors: Xiao Andy Shen, San Bruno, CA (US); Yu Sheng Bai, Los Altos Hills, CA (US)

(73) Assignee: FutureWei Technologies, Inc., Plano, TX (US)

( * ) Notice: Subject to any disclaimer, the term of this patent is extended or adjusted under 35 U.S.C. 154(b) by 248 days.

(21) Appl. No.: 11/858,868

(22) Filed: Sep. 20, 2007

(65) Prior Publication Data

US 2008/0089697 A1    Apr. 17, 2008

Related U.S. Application Data

(60) Provisional application No. 60/829,013, filed on Oct. 11, 2006.

(51) Int. Cl.
*G02B 6/34* (2006.01)
*G02B 6/26* (2006.01)

(52) U.S. Cl. .......................................... 385/37; 385/14

(58) Field of Classification Search .................... 385/37, 385/14
See application file for complete search history.

(56) References Cited

U.S. PATENT DOCUMENTS

| | | |
|---|---|---|
| 3,204,418 A | 9/1965 | Mathews |
| 5,061,032 A | 10/1991 | Meltz et al. |
| 5,206,920 A | 4/1993 | Cremer |
| 5,349,821 A | 9/1994 | Schrage |
| 5,488,678 A * | 1/1996 | Taneya et al. ................ 385/14 |
| 5,617,234 A | 4/1997 | Koga et al. |
| 6,027,254 A | 2/2000 | Yamada et al. |
| 6,064,783 A | 5/2000 | Congdon et al. |
| 6,108,472 A | 8/2000 | Rickman et al. |
| 6,219,470 B1 | 4/2001 | Tu |
| 6,356,692 B1 | 3/2002 | Ido et al. |
| 6,377,725 B1 | 4/2002 | Stevens et al. |

(Continued)

FOREIGN PATENT DOCUMENTS

CN    1252654 A    5/2000

(Continued)

OTHER PUBLICATIONS

Feder et al, "In-Fiber Spectrometer Using Tilted Fiber Gratings", IEEE Phototonics Technology Letters, vol. 15, No. 7, Jul. 2003, pp. 933-935.

(Continued)

*Primary Examiner* — K. Cyrus Kianni (57) ABSTRACT

An integrated DWDM transmitter apparatus includes a silica-on-silicon substrate which includes a silica layer and a silicon layer. A plurality of input waveguides and a plurality of gratings are provided within the silica layer. Each of the plurality of gratings is coupled to a corresponding one of the input waveguides. An arrayed waveguide grating within the silica layer is coupled to the plurality of input waveguides, and at least an output waveguide within the silica layer are coupled to the arrayed waveguide grating. The transmitter also includes a plurality of lasers disposed in a recessed region of the silica-on-silicon substrate, and each of the lasers is optically coupled to a corresponding one of the plurality of input waveguides. The integrated transmitter also includes plurality of photodiodes, each of the plurality of photodiodes overlying a corresponding one of the plurality of grating.

13 Claims, 5 Drawing Sheets

U.S. PATENT DOCUMENTS

| | | | |
|---|---|---|---|
| 6,393,185 B1 * | 5/2002 | Deacon | 385/50 |
| 6,445,477 B1 | 9/2002 | Madsen et al. | |
| 6,486,440 B1 | 11/2002 | Crafts et al. | |
| 6,539,725 B2 | 4/2003 | Bell | |
| 6,556,752 B2 | 4/2003 | Fang et al. | |
| 6,567,198 B1 | 5/2003 | Kang | |
| 6,628,850 B1 | 9/2003 | Yao | |
| 6,657,723 B2 * | 12/2003 | Cohen et al. | 356/328 |
| 6,865,304 B1 | 3/2005 | Ticknor | |
| 6,865,320 B1 | 3/2005 | Westbrook | |
| 6,873,763 B2 * | 3/2005 | Nikonov | 385/37 |
| 6,947,639 B2 * | 9/2005 | Singh et al. | 385/37 |
| 6,952,504 B2 * | 10/2005 | Bi et al. | 385/9 |
| 7,050,666 B2 | 5/2006 | Welch et al. | |
| 7,058,245 B2 * | 6/2006 | Farahi | 385/14 |
| 7,062,114 B2 * | 6/2006 | Webjorn et al. | 385/14 |
| 7,203,401 B2 * | 4/2007 | Mossberg et al. | 385/37 |
| 7,245,379 B2 * | 7/2007 | Schwabe | 356/436 |
| 7,366,364 B2 * | 4/2008 | Singh et al. | 385/11 |
| 7,447,393 B2 * | 11/2008 | Yan et al. | 385/14 |
| 7,460,742 B2 * | 12/2008 | Joyner | 385/14 |
| 7,483,599 B2 * | 1/2009 | Kish et al. | 385/14 |
| 2001/0041025 A1 * | 11/2001 | Farahi | 385/14 |
| 2001/0052234 A1 | 12/2001 | Venkatasubramanian | |
| 2003/0006224 A1 | 1/2003 | Crafts et al. | |
| 2003/0016415 A1 | 1/2003 | Jun et al. | |
| 2003/0039015 A1 | 2/2003 | Vujkovic-Cvijin et al. | |
| 2003/0095737 A1 * | 5/2003 | Welch et al. | 385/14 |
| 2003/0197862 A1 * | 10/2003 | Cohen et al. | 356/328 |
| 2004/0067006 A1 * | 4/2004 | Welch et al. | 385/14 |
| 2004/0081410 A1 | 4/2004 | Aronson et al. | |
| 2004/0131302 A1 | 7/2004 | Kouta et al. | |
| 2004/0208444 A1 | 10/2004 | Grunnet-Jepsen et al. | |
| 2005/0018951 A1 * | 1/2005 | Mossberg et al. | 385/14 |
| 2005/0068536 A1 * | 3/2005 | Schwabe | 356/436 |
| 2005/0094926 A1 * | 5/2005 | Dominic et al. | 385/14 |
| 2005/0100290 A1 | 5/2005 | Huang | |
| 2005/0100345 A1 | 5/2005 | Welch et al. | |
| 2005/0163171 A1 | 7/2005 | Ng et al. | |
| 2005/0210883 A1 | 9/2005 | Bell | |
| 2006/0002443 A1 * | 1/2006 | Farber et al. | 372/50.1 |
| 2006/0141649 A1 | 6/2006 | Joyner et al. | |
| 2006/0193553 A1 * | 8/2006 | Mossberg et al. | 385/14 |
| 2006/0279734 A1 * | 12/2006 | Yan et al. | 356/329 |
| 2007/0268489 A1 * | 11/2007 | Schwabe | 356/337 |
| 2008/0070610 A1 | 3/2008 | Nishio | |
| 2009/0087138 A1 * | 4/2009 | Yan et al. | 385/14 |

FOREIGN PATENT DOCUMENTS

| | | |
|---|---|---|
| CN | 1287542 A | 3/2001 |
| CN | 1303195 A | 7/2001 |
| CN | 1423140 A | 6/2003 |
| CN | 1453599 A | 11/2003 |
| CN | 1553239 A | 12/2004 |
| CN | 1639614 A | 7/2005 |
| EP | 0495413 A | 7/1992 |
| EP | 0497358 A | 8/1992 |
| EP | 0 573 724 A1 | 12/1993 |
| EP | 1 028 503 A2 | 8/2000 |
| EP | 133082 A | 9/2001 |
| EP | 1 436 931 B1 | 12/2005 |
| JP | 05323246 A | 12/1993 |
| JP | 06-089955 | 3/1994 |
| JP | 09-83056 A | 3/1997 |
| JP | 10233548 A | 9/1998 |
| JP | 11202159 A | 7/1999 |
| JP | 11211924 A | 8/1999 |
| JP | 2000162455 | 6/2000 |
| JP | 2000236135 A | 8/2000 |
| JP | 2000249853 A | 9/2000 |
| JP | 2000294809 A | 10/2000 |
| JP | 2001051136 A | 2/2001 |
| JP | 2001051142 A | 2/2001 |
| JP | 2001111156 A | 4/2001 |
| JP | 2001-147336 | 5/2001 |
| JP | 2001244571 A | 9/2001 |
| JP | 2002055249 A | 2/2002 |
| JP | 2002258080 A | 9/2002 |
| JP | 2003014994 A | 1/2003 |
| JP | 2003513328 T | 4/2003 |
| JP | 2005010373 A | 1/2005 |
| JP | 2005215942 A | 8/2005 |
| JP | 2006230236 A | 9/2006 |
| WO | WO 01/33268 A1 | 5/2001 |
| WO | WO 2005/013446 A1 | 2/2005 |
| WO | WO 2006/019362 A1 | 2/2006 |
| WO | WO 2008/043288 A1 | 4/2008 |
| WO | WO 2008/043318 A1 | 4/2008 |
| WO | WO 2008/049372 A1 | 5/2008 |
| WO | WO 2008/122221 A1 | 10/2008 |

OTHER PUBLICATIONS

Westbrook et al, "In-Line Polarimeter Using Blazed Fiber Gratings", IEEE Phototonics Technology Letters, vol. 12, No. 10, Oct. 2000, pp. 1352-1354.

Kwong et al., "Novel Single Mode Laser Fabrication Using Focus Ion Beam (FIB) Etching," Optical Fiber Communication Conference, 2006 and the 2006 National Fiber Optic Engineers Conference 2006, Mar. 5-10, 2006, 3 pages.

Li, et al. "Hybrid Integration", Optical Fiber Telecommunications IIIB, Lucent Technologies 1997, pp. 367-368.

Yoshikuni, Yuzo, "Semiconductor Arrayed Waveguide Gratings for Photonic Integrated Devices," IEEE Journal of Selected Topics in Quantum Electronics, vol. 8, No. 6, Nov./Dec. 2002.

Zirngibl, et al., "WDM receiver by monolithic integration of an optical preamplifier, waveguide grating router and photodiode array," Electronics Letters, vol. 31, No. 7, p. 581, (Mar. 30, 1995).

S.Y. Huang et al., "Performance and Reliability of Redundant Thermoelectric Coolers", Electronic Components and Technology Conference, May 11-16, 1991, pp. 34-37.

T. Ohyama et al., "4-Channel x 10-Gbit/s Hybrid Integrated Multiwavelength Laser Module Using Silica-Based Planar Lightwave Circuit Platform with 1.5%.-Δ", 28th European Conference on Optical Communication, 2002, vol. 2, Integration and Modules 5.4.1, 2 pages.

Marko Lackovic, et al., "Sensitivity Analysis of Component Failures in the Switched WDM Network", In Proceedings of Optical Networking Design and Modeling (ONDM) (Ghent, Belgium, Feb. 2-4, 2004), pp. 205-224.

Radhakrishnan Nagarajan, et al., "Large-Scale Photonic Integrated Circuits", IEEE Journal of Selected Topics in Quantum Electronics, vol. 11, No. 1, Jan./Feb. 2005, pp. 50-65.

International Search Report and Written Opinion of PCT Application No. PCT/CN2007/071128, date of mailing Mar. 20, 2008.

International Search Report and Written Opinion of PCT Application No. PCT/CN2007/070806, date of mailing Dec. 6, 2007.

Communication pursuant to Article 94(3) EPC dated Apr. 30, 2010 in connection with European Patent Application No. 07 816 997.6.

Partial Translation of Office Action dated Jun. 2, 2010 in connection with Chinese Patent Application No. 200780029963.2.

Xingsheng Liu, et al., "Comparison Between Epi-Down and Epi-Up Bonded High-Power Single-Mode 980-nm Semiconductor Lasers", IEEE Transactions on Advanced Packaging, vol. 27, No. 4, Nov. 2004, pp. 640-646.

Toshikazu Hashimoto, et al., "Multichip Optical Hybrid integration Technique with Planar Lightwave Circuit Platform", Journal of Lightwave Technology, vol. 16, No. 7, Jul. 1998, pp. 1249-1258.

A. Tervonen, et al., "Control of wavelength alignment in wavelength division multiple access passive optical network", Electronics Letters, vol. 39, No. 2, Jan. 23, 2003, 2 pages.

Akimasa Kaneko, et al., "Design and Applications of Silica-Based Planar Lightwave Circuits", IEEE Journal of Selected Topics in Quantum Electronics, vol. 5, No. 5, Sep./Oct. 1999, pp. 1227-1236.

Y. Tohmori, et al., "Spot-size converted 1.3μm laser with butt-jointed selectively grown vertically tapered waveguide", Electronics Letters, vol. 31, No. 13, Jun. 22, 1995, pp. 1069-1070.

Toshikazu Hashimoto, et al., "Hybrid Integration of Spot-Size Converted Laser Diode on Planar Lightwave Circuit Platform by Passive Alignment Technique", IEEE Photonics Technology Letters, vol. 8, No. 11, Nov. 1996, pp. 1504-1506.

C.H. Henry, et al., "Glass Waveguides on Silicon for Hybrid Optical Packaging", Journal of Lightwave Technology, vol. 7, No. 10, Oct. 1989, pp. 1530-1539.

L.J.P. Ketelsen, et al., "Multiwavelength DFB Laser Array with Integrated Spot Size Converters", IEEE Journal of Quantum Electronics, vol. 36, No. 6, Jun. 2000, pp. 641-648.

T.L. Koch, et al., "Tapered Waveguide InGaAs/InGaAsP Multiple-Quantum-Well Lasers", IEEE Photonics Technology Letters, vol. 2, No. 2, Feb. 1990, pp. 88-90.

I.F. Lealman, et al., "1.56μm InGaAsP/InP tapered aclive layer multiquantum well laser with improved coupling to cleaved singlemode fibre", Electronics Letters, Vo. 30, No. 11, May 26, 1994, pp. 857-859.

Ikuo Ogawa, et al., "Reduction of Waveguide Facet Reflection in Optical Hybrid Integrated Circuit Using Saw-Toothed Angled Facet", IEEE Photonics Technology Letters, vol. 7, No. 1, Jan. 1995, pp. 44-46.

Marko Labudovic, et al., "Heat Transfer and Residual Stress Modeling of a Diamond Film Heat Sink for High Power Laser Diodes", IEEE Transactions on Components and Packaging Technologies, vol. 26, No. 3, Sep. 2003, pp. 575-581.

Communication pursuant to Article 94(3) EPC dated May 27, 2009 in connection with European Patent Application No. 07 817 120.4.

Supplementary European Search Report dated Jan. 14, 2009 in connection with European Patent Application No. 07 817 120.4.

Translation of Office Action dated Nov. 12, 2010 in connection with Chinese Patent Application No. 200780018559.5.

Decision to refuse a European Patent Application dated Mar. 29, 2010 in connection with European Patent Application No. 07 817 120.4.

Summons to attend oral proceedings pursuant to Rule 115(1) EPC dated Oct. 13, 2009 in connection with European Patent Application No. 07 817 120.4.4.

Karsten Drogemuller, "Cost Effective Multi Optical Channel DWDM Transmitter Modules for the Metro Market", 2001 IEEE, pp. 109-110.

Communication pursuant to Article 94(3) EPC dated May 27, 2009 in connection with European Patent Application No. 07 801 079.0.

Supplementary European Search Report dated Nov. 5, 2009 in connection with European Patent Application No. 08 71 5157.

Notification of Transmittal of the International Search Report and the Written Opinion of The International Searching Authority, or the Declaration dated May 15, 2008 in connection with International Patent Application No. PCT/CN2008/070421.

Su Hwan Oh, et al., "Fabrication of WDM-PON OLT Source using External Cavity Laser", The 5th International Conference on Optical Internet (COIN 2006), Jul. 9-13, 2006, pp. 217-219.

Notice of Reasons for Rejection dated Mar. 22, 2011 in connection with Japanese Patent Application No. 2008-548920.

Written Opion of the International Searching Authority dated Dec. 20, 2007 in connection with International Patent Application No. PCT/CN2007/070671.

Translation of Office Action dated Sep. 26, 2010 in connection with Chinese Patent Application No. 200780029963.2.

Translation of Office Action dated Feb. 9, 2011 in connection with Chinese Patent Application No. 200780029963.2.

* cited by examiner

METHOD AND SYSTEM FOR GRATING TAPS FOR MONITORING A DWDM TRANSMITTER ARRAY INTEGRATED ON A PLC PLATFORM

CROSS-REFERENCES TO RELATED APPLICATIONS

This application claims priority to U.S. Provisional Patent Application No. 60/829,013, filed Oct. 11, 2006, commonly assigned, incorporated herein by reference for all purposes. Additionally, this application is related to co-pending U.S. patent application Ser. No. 11/829,295, filed Jul. 27, 2007, commonly assigned, incorporated by reference herein for all purposes.

BACKGROUND OF THE INVENTION

The present invention is directed to fiber optical transport systems. More particularly, an embodiment of the invention provides a compact, low-cost, integratable solution for monitoring individual optical power in a DWDM transmitter array integrated on a planar lightwave circuit (PLC) platform. Merely by way of example, the invention provides a method for using weak refractive index gratings formed on a silica/silicon waveguide to redirect a portion of the optical power vertically out of the transmission medium for detection by a photodiode flip-chip bonded on the PLC above the grating. But it would be recognized that the invention has a much broader range of applicability.

Considerable effort has been devoted to the development of compact, low-cost transmitters for dense wavelength division multiplexing (DWDM) applications since early 1990s. One of the promising approaches is to integrate semiconductor lasers, optical taps, and silica-based waveguide devices such as arrayed waveguide grating (AWG) or couplers, together to have a 1×N DWDM transmitter array. Compared to discrete devices, this approach eliminates fiber jumpers between transmitters and the MUX unit. Also, instead of packaging each transmitter and MUX individually with their own physical cases and fiber pigtails, this hybrid integration uses only one box with significantly low number of pigtails. In addition, the physical size of the transmitter array is much smaller than those made with discrete devices, increasing considerably the port density.

Even though these conventional DWDM systems are useful in some areas, they have many limitations that restrict their effectiveness in broader applications. Some of these limitations are discussed below, and then improved techniques based on embodiments of the present invention are provided.

BRIEF SUMMARY OF THE INVENTION

The present invention is directed to fiber optical transport systems. More particularly, an embodiment of the invention provides a compact, low-cost, integratable solution for monitoring individual optical power in a DWDM transmitter array integrated on a PLC platform. Merely by way of example, the invention provides a method for using weak refractive index gratings formed on a silica/silicon waveguide to redirect a portion of the optical power vertically out of the transmission medium for detection by a photodiode flip-chip bonded on the PLC above the grating. But it would be recognized that the invention has a much broader range of applicability.

According to a specific embodiment, the invention provides an integrated DWDM transmitter apparatus which includes a silica-on-silicon substrate, which includes a silica layer and a silicon layer. The silica-on-silicon substrate also includes a recessed region. The transmitter includes a plurality of input waveguides within the silica layer and a plurality of gratings within the silica layer. Each of the plurality of gratings is coupled to a corresponding one of the input waveguides. An arrayed waveguide grating is disposed within the silica layer and coupled to the plurality of input waveguides. At least an output waveguide is disposed within the silica layer and coupled to the arrayed waveguide grating. The transmitter also includes a plurality of lasers disposed in the recessed region of the silica-on-silicon substrate. Each of the lasers is optically coupled to a corresponding one of the plurality of input waveguides. The transmitter also includes a plurality of photodiodes, each of which overlying a corresponding one of the plurality of gratings.

In an embodiment of the transmitter, each of the input waveguides within the silica layer includes a core region surrounded by a cladding region. The core region is characterized by an index of refraction higher than an index of refraction of the cladding region. In an embodiment, each of the plurality of gratings is disposed in a portion of the cladding region above the core region. Each of the gratings includes a plurality of grating elements. In an embodiment, each of the plurality of gratings includes a plurality of diffraction regions in the cladding region, and the plurality of diffraction regions is characterized by a refractive index different from a refractive index of the cladding region. In a specific example, the cladding region is formed in undoped silica, and the diffraction regions are formed in doped silica. In an embodiment, each of the plurality of gratings includes a plurality of grating elements in a portion of the cladding region. The pitch of the plurality of grating elements is selected to provide maximum diffracted power at 90 degrees relative to an axis of the core region while avoiding back reflection. In some embodiments, an input waveguide is characterized by DWDM wavelengths in a band between a first wavelength $\lambda_1$ and a second wavelength $\lambda_2$, and a pitch of the grating elements in each of the plurality of gratings is selected from outside the ranges between $$L_1 = m\frac{(\lambda_1/n)}{2} \text{ and } L_2 = m\frac{(\lambda_2/n)}{2},$$

where n is a refractive index of the waveguide and m is an integer. In a specific embodiment, the core region includes doped silica and the cladding region includes undoped silica. In an embodiment, an input waveguide is characterized by DWDM wavelengths in C band (1530-1560 nm), and a pitch of the plurality of grating elements is selected from outside the ranges between 510-520 nm, 1020-1040 nm, or 1530-1560 nm.

According to an alternative embodiment, the invention provides a method for forming an integrated DWDM transmitter apparatus. The method includes providing a silicon layer and forming an optical multiplexer within a silica layer on the silicon layer. The optical multiplexer includes a plurality of input waveguides and at least an output waveguide. The forming the optical multiplexer includes the following processes: forming a first silica cladding layer on the silicon layer, forming a silica core layer on the first silica cladding layer, etching at least a portion of the silica core layer, and depositing a second silica cladding layer on the etched silica core layer and the first silica cladding layer.

The method also includes forming a plurality of gratings within the second silica cladding layer. Each of the plurality of gratings is coupled to a corresponding one of the input waveguides. The method includes removing at least a first portion of the silica layer to expose a surface, and mounting a plurality of semiconductor lasers to the surface. Each of the lasers is optically coupled to a corresponding one of the plurality of input waveguides. The method further includes attaching a plurality of photodiodes to the silica layer, with each of the plurality of photodiodes overlying a corresponding one of the plurality of gratings.

In a specific embodiment of the method, the first silica cladding layer includes an un-doped silica layer. In an embodiment, the second silica cladding layer includes an un-doped silica layer. In an embodiment, the silica core layer comprises a doped silica layer. In a specific embodiment, each of the plurality of gratings includes a plurality of diffraction regions in a portion of the cladding region above the core region. The plurality of diffraction regions is characterized by a refractive index different from a refractive index of the cladding region. In a specific embodiment, the cladding region is formed in undoped silica, and the diffraction regions are formed in doped silica. In an alternative embodiment, the plurality of gratings is formed using UV exposure with a mask. In a specific embodiment, each of the plurality of gratings includes a plurality of grating elements in a portion of the cladding region, and a pitch of the plurality of grating elements is selected to provide maximum diffracted power at 90 degrees relative to an axis of the core region while avoiding back reflection.

Many benefits are achieved by way of the present invention over conventional techniques. For example, in certain embodiments, the invention provides a compact, low-cost, integratable solution for monitoring optical power in a DWDM transmitter array integrated on a PLC platform. Some embodiments of the present invention offer a much compact, low cost solution to the monitoring of optical power in integrated active/passive optics. In specific embodiments, the light redirecting method requires no additional "real estate" on the chip and offers better or comparable performance compared to other conventional techniques. Various embodiments of the present invention also remove some restrictions on laser transmitters compared to monolithic integration of laser and photodiode. Thus, higher performance transmitter as well as integrated optical devices can be built using this invention.

Various additional objects, features, and advantages of the present invention can be more fully appreciated with reference to the detailed description and accompanying drawings that follows.

DETAILED DESCRIPTION OF THE INVENTION

The present invention is directed to fiber optical transport systems. More particularly, an embodiment of the invention provides a compact, low-cost, integratable solution for monitoring individual optical power in a DWDM transmitter array integrated on a PLC platform. Merely by way of example, the invention provides a method for using weak refractive index gratings formed on a silica/silicon waveguide to redirect a portion of the optical power vertically out of the transmission medium for detection by a photodiode flip-chip bonded on the PLC above the grating. But it would be recognized that the invention has a much broader range of applicability.

As discussed above, the number of components and the size of an optical transmitter array can be reduced by integrating semiconductor lasers, optical taps, and silica-based waveguide devices such as AWG or couplers, together to have a 1×N WDM transmitter array.

However, such an integration approach, though sounds in theory, has many difficulties when one tries to implement. For example, to have a good yield, one wants to avoid the integration of any optical amplifiers, such as semiconductor optical amplifier (SOA) into the transmitter. Without SOA, the transmitter power after MUX is often not sufficient for long reach applications, e.g., over 80 km. An issue related to transmitter launch power is the requirement of using discrete photodiode chips for power monitoring. A signal often must be tapped along its optical path with an optical coupler. In such an integration approach, it means use of integrated coupler along with mechanisms of directing light from coupler output to a detector, increasing significantly the complexity of the integration and hence the cost.

Current techniques for monitoring optical signals in PLC waveguides include making additional waveguides weakly coupled to the waveguides having signals to be monitored and routing the waveguides to an edge of the chip where the light can be detected by a photodiode. These techniques, while effective, require large chip size to prevent crossing of waveguides, but they provide insufficient space for attaching photodiodes (PDs) at the edge, especially when the number of integrated transmitters increases.

Monolithic integration of a tap with a transmitter, such as a distributed feedback (DFB) laser, although common, reduces the output power of the transmitter. In many DWDM applications, this reduction translates to smaller networks and shorter reach.

From the above, it is seen that a new, simpler, and cost-effective approach to monitoring optical power in an integrated DWDM transmitter is thus called for.

Depending upon the embodiment, the present invention includes various features, which may be used. These features include the following:

1. Periodical changes in refractive index in an integrated waveguide are used to redirect a portion of light out of waveguides;
2. A method is provided for placing of the grating structure outside the waveguide core in a cladding region;
3. The redirected angle can be set at close to but not equal to 90 degrees angle with respect to the waveguide surface, or any other desired angles without back reflection; and
4. A method is provided for forming such a periodical structures.

As shown, the above features may be in one or more of the embodiments provided below. These features are merely examples, which should not unduly limit the scope of the application. One of ordinary skill in the art would recognize many variations, modifications, and alternatives.

Figure 1:
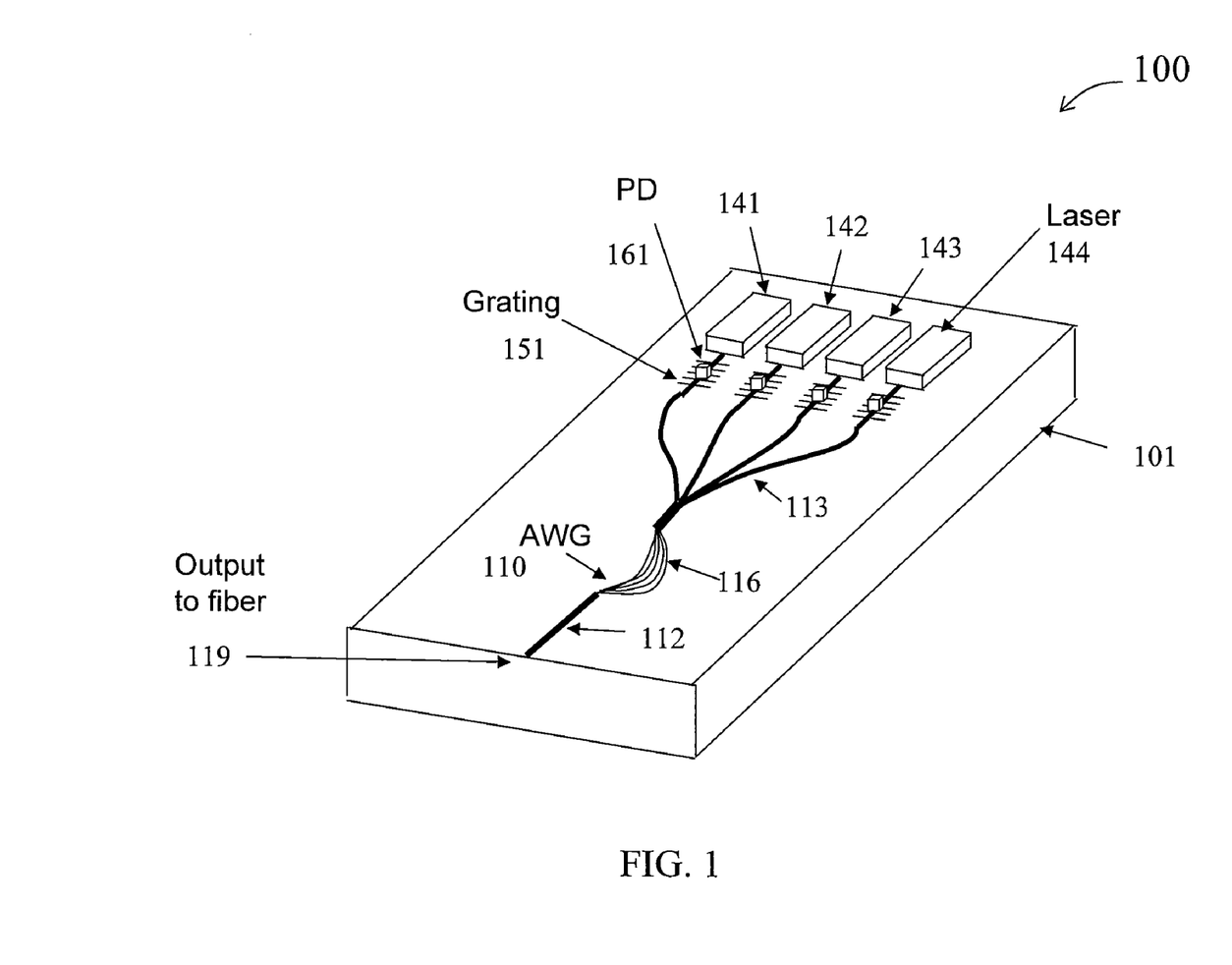
FIG. 1 is a simplified view diagram of an integrated 1×4 DWDM transmitter array using grating taps for power monitoring according to an embodiment of the present invention.

FIG. 1 is a simplified view diagram of an integrated 1×4 DWDM transmitter array using grating taps for power monitoring according to an embodiment of the present invention. This diagram is merely an example, which should not unduly limit the scope of the claims herein. One of ordinary skill in the art would recognize other variations, modifications, and alternatives. As shown, integrated DWDM transmitter 100 includes a silicon bench 101 and an optical multiplexer in the silicon bench. In a specific embodiment, the optical multiplexer includes an arrayed waveguide grating (AWG) 110 made in a silica-on-silicon planar lightwave circuit (PLC) in the silicon bench. Integrated transmitter 100 further includes one or more lasers, e.g., 141 to 144. In a preferred embodiment, the lasers include DML lasers made in InP. In some embodiments, lasers 141-144 can be formed in an laser array chip. In other embodiments, lasers 141-144 may be individual laser chips. Of course, there can be other variations, modifications, and alternatives.

In a specific embodiment, the AWG 110 includes one optical output waveguide 112, multiple input waveguides 113, and grating waveguides 116. In an embodiment, the output waveguide 112 is optically coupled to an optical fiber 119, which may be coupled to an optical transmission system. In a specific embodiment, the grating waveguides 116 include a number of waveguides for coupling to the input and output waveguides. The grating waveguides in 116 have varying lengths for performing wavelength division multiplexing and demultiplexing functions.

According to an embodiment of the present invention, integrated transmitter 100 includes grating taps, such as 151, coupled to the input waveguides for monitoring the optical power in the waveguide. In a specific embodiment, a photodiode, such as 161, and a grating tap, such as 151, are coupled to an input waveguide. More details of the integrated transmitter is provided below.

Figure 2A:
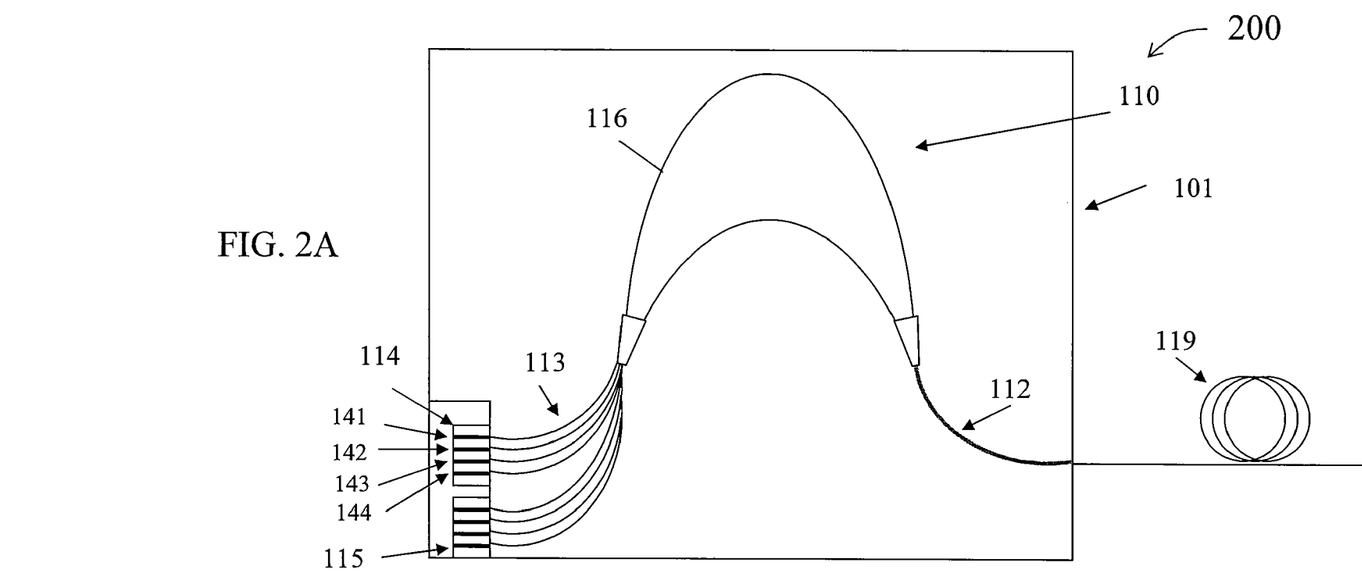
FIG. 2A is a simplified top view diagram of a hybrid integrated DWDM transmitter according to another embodiment of the present invention.

FIG. 2A is a simplified top view diagram of a hybrid integrated DWDM transmitter according to an embodiment of the present invention. This diagram is merely an example, which should not unduly limit the scope of the claims herein. One of ordinary skill in the art would recognize other variations, modifications, and alternatives. For easy reference, similar components are labeled with the same numerals in FIGS. 1, 2A, and 2B. As shown in FIG. 2A, hybrid integrated DWDM transmitter 200 includes a silicon bench 101. In a specific embodiment, the silicon bench 101 includes a silica-on-silicon substrate. Hybrid transmitter 200 also includes an optical multiplexer in the silicon bench. In a specific embodiment, the optical multiplexer includes an arrayed waveguide grating (AWG) 110 made in a silica-on-silicon planar lightwave circuit (PLC) in the silicon bench. Hybrid transmitter 200 further includes one or more multiple laser array chips, e.g., 114 and 115. In a preferred embodiment, the laser array chips include DML lasers made in InP. In a specific embodiment, each InP laser array chip includes two or more lasers, for example, lasers 141 to 144. In other embodiments, lasers 141 to 144 can be formed in individual laser chips. Of course, there can be other variations, modifications, and alternatives.

In a specific embodiment, the AWG 110 includes one optical output port 112, multiple input ports 113, and grating waveguides 116. In an embodiment, the output port 112 is optically coupled to an optical fiber 119, which may be coupled to an optical transmission system. The output and input ports, for example, can all be implemented in the form of waveguides. In a specific embodiment, the grating waveguides 116 include a number of waveguides for coupling to the input and output ports. These waveguides have varying lengths for performing wavelength division multiplexing and demultiplexing functions. In some embodiments, each input port of the AWG has a center wavelength and pass band associated with light transmission. In a specific embodiment, the center wavelength corresponds to a particular wavelength associated with a frequency defined by ITU-T standards, for example, 193.1 THz.

Figure 2B:
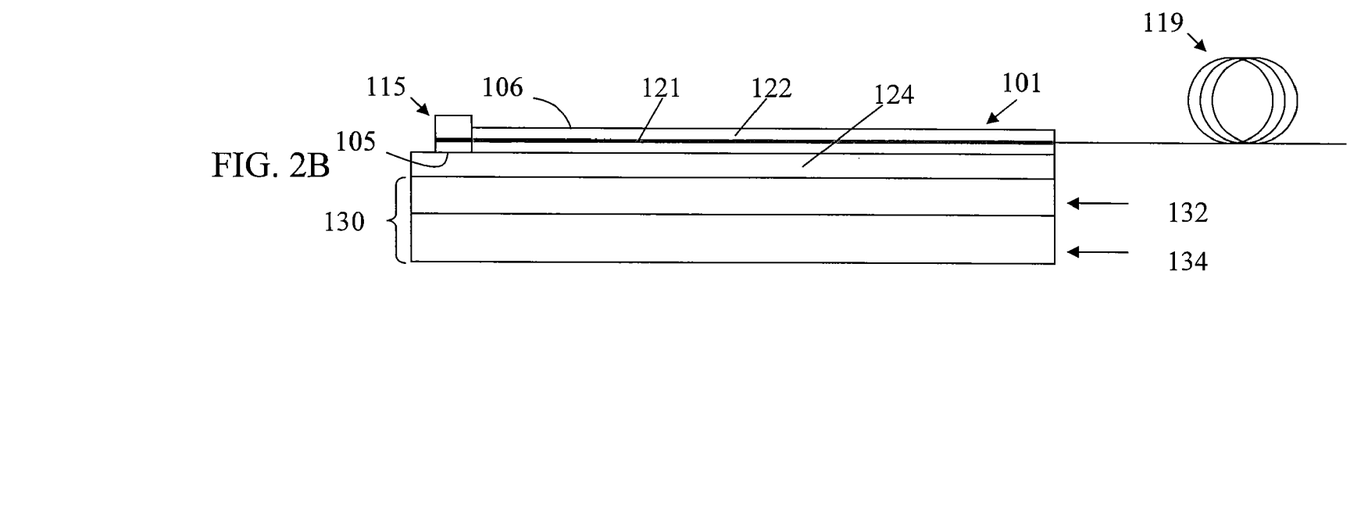
FIG. 2B is a simplified expanded cross-sectional view diagram of a hybrid integrated DWDM transmitter of FIG. 2A according to another embodiment of the invention.

FIG. 2B is a simplified cross-sectional view diagram of the hybrid integrated DWDM transmitter 200 of FIG. 2A according to an embodiment of the invention. This diagram is merely an example, which should not unduly limit the scope of the claims herein. One of ordinary skill in the art would recognize other variations, modifications, and alternatives. As shown, a waveguide includes doped silica region 121 enclosed in an undoped silica layer 122 on a silicon substrate 124. In a specific embodiment, the doped silica region 121 has a higher index of refraction than the undoped silica region. In a specific example, the doped silica region 121 has a index of refraction of about 1.47, and the undoped silica region has a index of refraction of about 1.45.

According to embodiments of the present invention, integrated transmitter 200 includes one or more laser array chips, and each laser array chip may include two or more lasers. In the specific embodiment shown in FIG. 2A, the integrated transmitter 200 includes two direct-modulated laser (DML) array chips 114 and 115. In this specific example, each of DML array chips 114 and 115 includes four direct-modulated lasers (DMLs) 141-144 made in InP. In other embodiments, lasers 141-144 can be individual laser chips. In a specific embodiment, the DMLs are of the types of distributed feedback (DFB) lasers and hence are operated in single frequency mode. In some embodiment, each DML works around a particular wavelength (frequency) defined by ITU-T standards, for example, 193.1 THz. Of course, one of ordinary skill in the art would recognize other variations, modifications, and alternatives.

According to some embodiments of the present invention, the DML arrays can also be single DML chips. In another embodiment, the DMLs can be substituted by integrated CW lasers and modulators, for example, an integrated DFB laser with an electro-absorption (EA) modulator. In an alternative embodiment, the lasers can also be distributed Bragg grating (DBR) lasers. In various embodiments, the AWG can be substituted by a broadband N×1 PLC waveguide combiner. In certain embodiments, an erbium doped fiber amplifier (EDFA) or an erbium doped waveguide amplifier (EDWA) can be used to compensate for the excess loss of the broadband combiner.

As shown in FIG. 2A, according to some embodiments of the present invention, the DML array chips are mounted on a portion of the silicon bench 101, in the vicinity of the input ports 113 of the AWG 110. In an embodiment, this mounting is performed using a p-side down, flip-chip method. Depending on the embodiment, other bonding methods using suitable adhesives can also be used. In FIG. 2B, the silicon bench 101 includes a silica-on-silicon substrate. A region of the silicon bench includes the AWG waveguide. In another region of the silicon bench, a portion of the silica is removed to form a recessed region, and the DML array chips are mounted on the surface of the remaining silica over the silicon substrate. In another embodiment, the silica layer in a second region of the silicon bench is removed, and the DML array chips are mounted on the exposed silicon surface.

According to a specific embodiment of the invention, the silicon bench is mounted on a support component 130, as shown in FIG. 2B. In a specific embodiment, the support component 130 includes an optional submount 132 and a temperature adjustment component 134. The temperature adjustment component keeps the optical components such as the waveguides, the AWG and the DMLs at a suitable operating temperature, for example ~25° C. In a specific embodiment, the temperature adjustment component includes a thermal electric cooler (TEC). In certain embodiments, integrated transmitter 100 also includes a micro heater in a proximity to each of the lasers for temperature adjustment. In an embodiment, at the operating temperature, the center wavelengths of the DMLs are matched approximately to those of the AWG input ports, for example, 193.1 THz, 193.2 THz, 193.3 THz, etc. Typically, the center wavelengths of the AWG can shift with temperature by ~0.01 nm/° C., and the center wavelengths of the InP lasers shift with temperature by ~0.1 nm/° C. In some embodiments, the support component 130 also includes a submount 132 on the temperature adjustment component 134. In an embodiment, the submount 132 is made of materials containing metal or ceramics which provide mechanic strength. The submount also has good thermal conductance as required for the temperature adjustment component to control the temperature of the optical components, such as the laser and waveguide.

Figure 3:
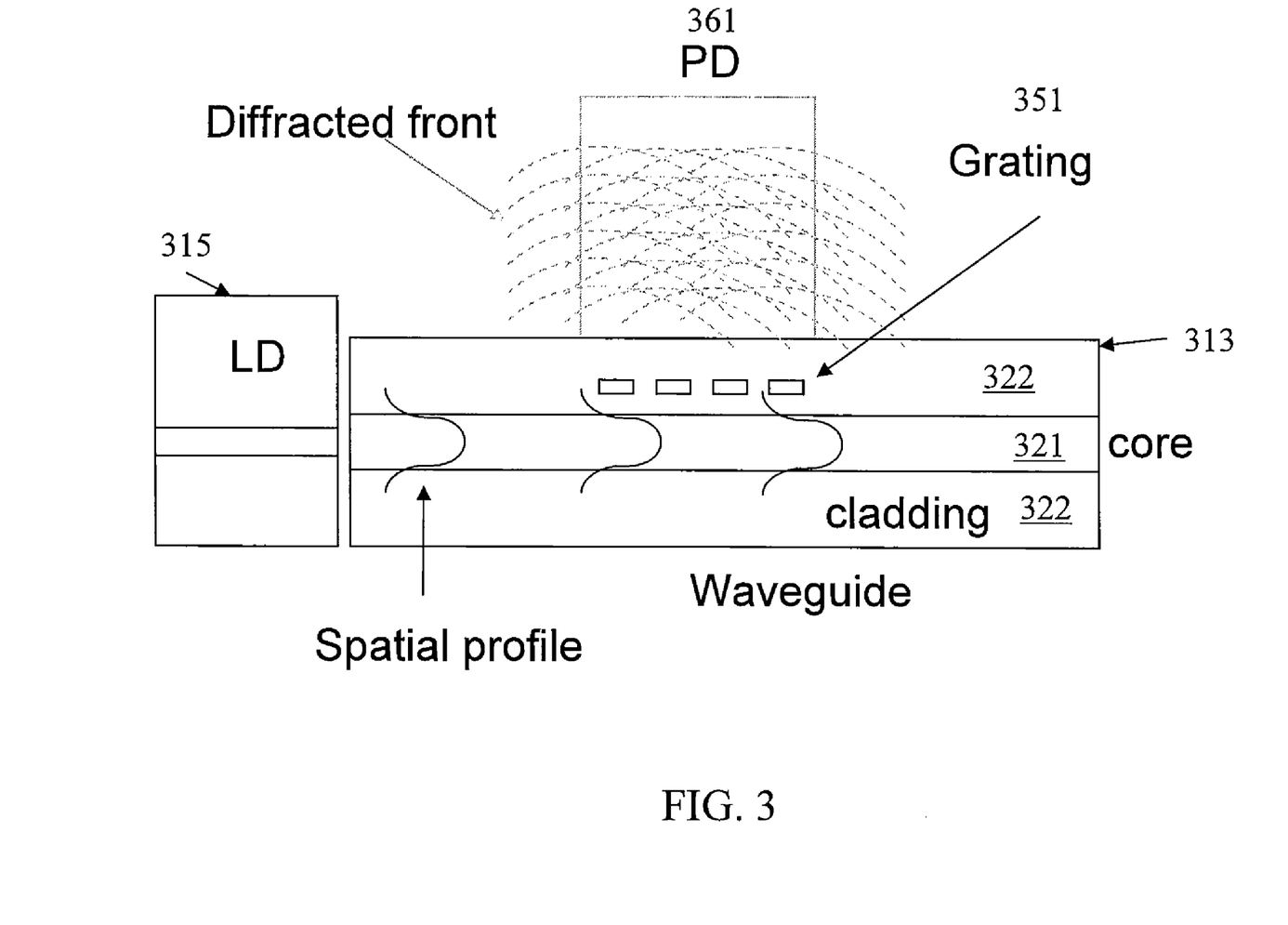
FIG. 3 is a simplified view diagram of a branch of an integrated transmitter array according to an embodiment of the present invention.

FIG. 3 is a simplified view diagram of a branch of an integrated transmitter array according to an embodiment of the present invention. This diagram is merely an example, which should not unduly limit the scope of the claims herein. One of ordinary skill in the art would recognize other variations, modifications, and alternatives. As shown, the cross sectional view diagram illustrates a portion of an input waveguide 313 which is located near a laser diode chip 315, before it is combined with other input waveguides at an AWG (not shown). In an embodiment, waveguide 313 is located in the silica layer as discussed with reference to FIGS. 2A and 2B. Waveguide 313 includes a core region 321 surrounded by a cladding region 322, similar to the waveguide shown in FIGS. 2A and 2B. In a specific embodiment, the core region is characterized by an index of refraction higher than that of the cladding layer. In an embodiment, the core region 321 can be a doped silica region enclosed in an undoped silica cladding region 322.

According to embodiments of the invention, a refractive index grating 351 is formed overlying the waveguide 313 which is coupled to the laser diode 315. Grating 351 usually includes multiple grating elements. In an embodiment, grating 351 includes a plurality of diffraction regions in a portion of the cladding region 322. These diffraction regions are characterized by a refractive index that is different from a refractive index of the cladding region. In an embodiment, the grating 351 is placed along the propagation direction in the cladding region 322 above the waveguide core region 321. As light propagates along the core, a portion of the light propagating in the cladding near the interfaces (known as cladding mode) sees a periodical change of refractive index when it reaches the grating 351. This portion of the light will be diffracted off the grating as shown in the above figure. Diffracted light from each pitch along the grating will interfere with each other constructively or destructively at different angles. A specific embodiment of the invention provides a design of the grating in which the constructive interference can occur in a direction almost vertical to the propagation direction. According to embodiments of the invention, the amount of the diffracted light from the grating is directly proportional to the light in the waveguide. In a specific embodiment of the invention, a photodiode 361 is placed above the grating 351, and the optical power in the waveguide can be monitored accurately.

In an embodiment as shown in FIG. 3, the grating is embedded in the waveguide chip on top of the core, and the photodiode is placed above the grating. Thus, according to embodiments of the invention, no additional chip space is required when designing such a transmitter. In an embodiment, the coupling efficiency from core to detector is largely determined by the distance of the grating to the cladding/core interface. The closer the distance is, the higher the efficiency.

In certain embodiments, the gratings are formed using techniques similar to that described above for forming waveguides. For example, the diffraction regions in a grating can be formed by depositing a grating material having a different refractive index from the cladding, etching the grating material into desired shapes, and covering it with a layer of the cladding material. In a specific embodiment, the cladding region is formed in undoped silica, and the diffraction regions can be formed in doped silica. Depending upon the embodiments, other methods can also be used. In some embodiments, gratings can be fabricated by UV exposure with a mask. For example, UV exposure can be used to modify the refractive index in certain diffraction regions in the cladding region of the waveguide to form gratings.

Figure 4:
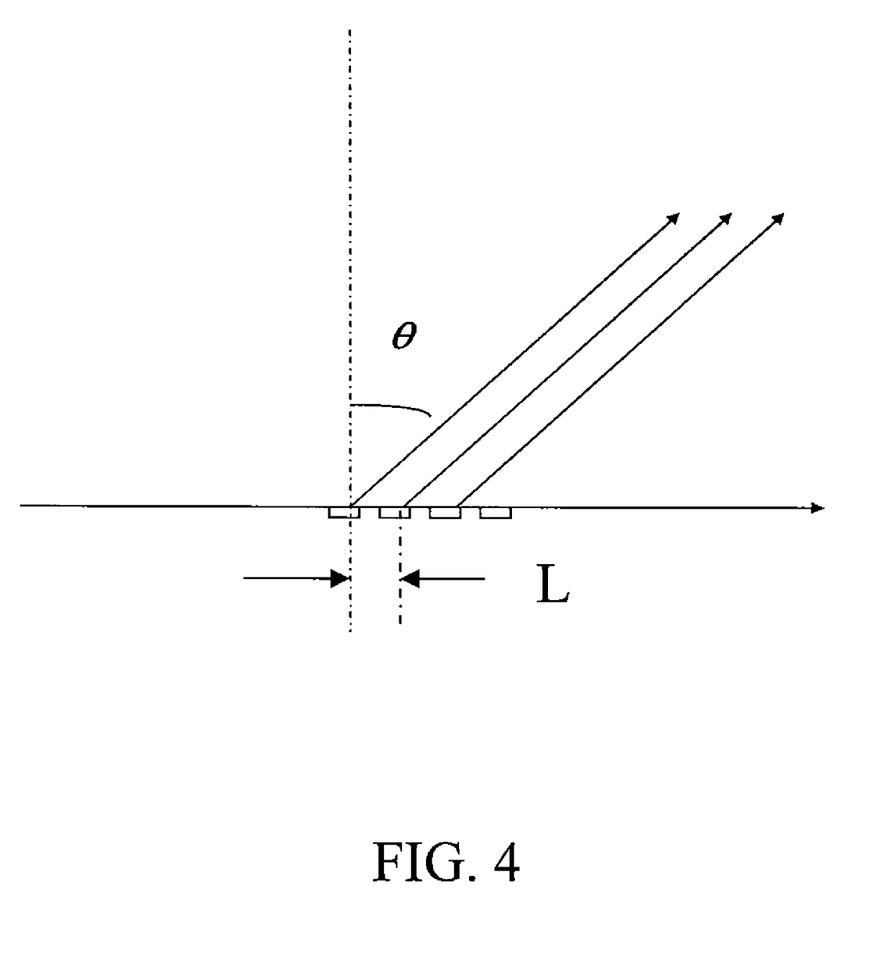
FIG. 4 is a simplified diagram illustrating interference conditions according to an embodiment of the present invention.

FIG. 4 is a simplified diagram illustrating interference conditions according to an embodiment of the present invention. This diagram is merely an example, which should not unduly limit the scope of the claims herein. One of ordinary skill in the art would recognize other variations, modifications, and alternatives. As shown in FIG. 3, the condition for constructive interference at a reflection angle near 90 degrees (vertical to the chip surface) is governed by the following expression, $$L - L*\sin(\theta) = m*\lambda/n$$

where $\theta$ is the angle deviated from 90 degrees, m is an integer, $\lambda$ is transmitter wavelength, n is the index of refraction in the waveguide, and L is the pitch of the periodic grating.

For the primary constructive interference, m=1, one would get maximum diffracted power at 90 degrees when L=$\lambda$/n. However, this condition generates strong back reflection as it resonates with lasing wavelength, giving raise to high wavelength/power instability of the transmitter. The general condition for having such a back reflections is given by having $\theta$ equal −90 degrees, i.e., $$L = m\frac{(\lambda/n)}{2}.$$

In an embodiment of the present invention, for DWDM wavelengths in C band (1530-1560 nm), this spacing in the silica waveguide (n=1.5) can not be between 510-520 nm, 1020-1040 nm, or 1530-1560 nm, etc. Therefore, according to a specific embodiment of the invention, the rule for choosing L is such that the spacing value should be as closer to $\lambda$ as possible but does not fall into any one window mentioned above. In other words, for a waveguide characterized by wavelengths in a band between a first wavelength $\lambda_1$ and a second wavelength $\lambda_2$, a pitch of grating elements in each of the gratings is selected from outside the ranges between $$L_1 = m\frac{(\lambda_1/n)}{2} \text{ and } L_2 = m\frac{(\lambda_2/n)}{2},$$

where n is the refractive index of the waveguide and m is an integer.

Although the above has been shown using a selected group of components for the integrated DWDM transmitter system, there can be many alternatives, modifications, and variations. For example, some of the components may be expanded and/or combined. Other components may be inserted to those noted above. Depending upon the embodiment, the arrangement of components may be interchanged with others replaced.

Figure 5:
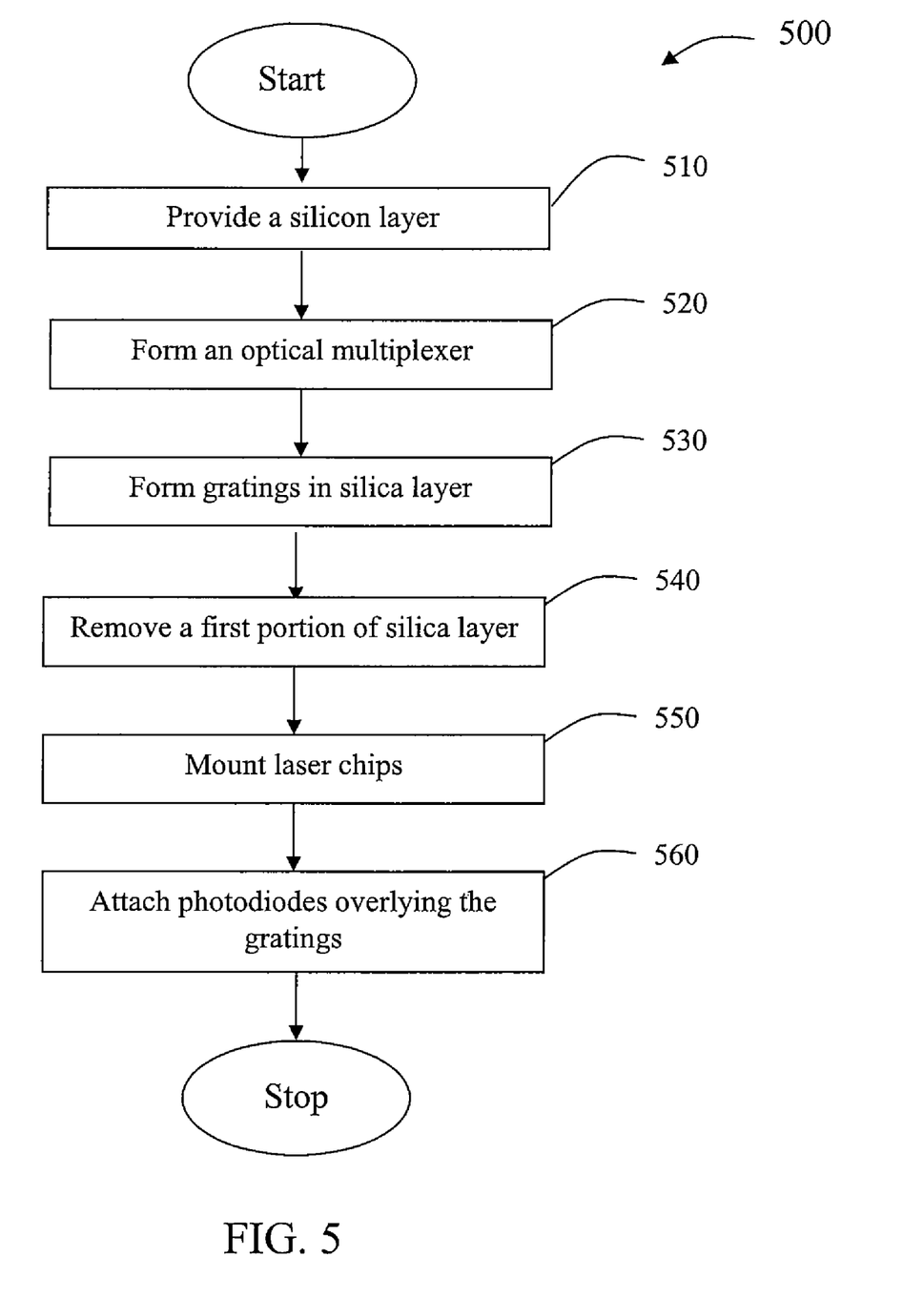
FIG. 5 is a simplified flowchart of a method for making in an integrated DWDM transmitter according to an embodiment of the present invention.

FIG. 5 is a simplified flowchart illustrating a method for making an integrated DWDM transmitter according to an embodiment of the invention. This diagram is merely an example, which should not unduly limit the scope of the claims herein. One of ordinary skill in the art would recognize other variations, modifications, and alternatives. The method can be briefly outlined below, with reference to the flowchart in FIG. 5.

1. (Process 510) Provide a silicon layer;
2. (Process 520) Form an optical multiplexer in a silica layer over the silicon layer;
3. (Process 530) Form gratings within the silica layer;
4. (Process 540) Remove a first portion of the silica layer to form a recess and to expose a surface;
5. (Process 550) Mount laser chips to the surface; and
6. (Process 560) Attach photodiodes overlying the gratings.

As shown, FIG. 5 illustrates a method for making an integrated DWDM transmitter apparatus. The method is now discussed below, and certain details can be better understood with reference to FIGS. 1-4. The method includes (Process 510) providing a silicon layer and (Process 520) forming an optical multiplexer within a silica layer located on the silicon layer. In an embodiment, the optical multiplexer includes a plurality of input waveguides and at least an output waveguide. In an embodiment, the optical multiplexer also includes an arrayed waveguide grating. In a specific embodiment, the process of forming the optical multiplexer (Process 520) includes the following processes: forming a first silica cladding layer on the silicon layer, forming a silica core layer on the first silica cladding layer, etching at least a portion of the silica core layer, and depositing a second silica cladding layer on the etched silica core layer and the first silica cladding layer. In an embodiment, the first silica cladding layer and the second cladding layers are un-doped silica layers. The silica core layer can be a doped silica layer.

In Process 530, the method includes forming gratings in the silica layer for directing optical signals to a photodiode for monitoring the optical power in a waveguide. As discussed above with reference to FIG. 3, in a specific embodiment, a refractive index grating 351 is etched on the waveguide 313 which is coupled to the laser diode 315. In a specific embodiment, grating 351 includes a plurality of diffraction regions in a portion of the cladding region 322. In an embodiment, the grating 351 is placed along the propagation direction in the cladding region 322 above the waveguide core region 321. In a specific embodiment, the cladding region is formed in undoped silica, and the diffraction regions can be formed in doped silica. In some embodiments, gratings can be fabricated by UV exposure with a mask. For example, UV exposure can be used to modify the refractive index in certain diffraction regions in the cladding region of the waveguide to form gratings.

In Process 540, the method includes removing at least a first portion of the silica layer to form a recessed region and to expose a surface. Depending on the embodiment, the exposed surface can be a silicon surface or a silica surface. In Process 550 the method includes mounting semiconductor laser chips to the surface. In a specific embodiment, each of the laser array chips includes one or more InP laser diodes. The mounting can be performed, for example, using a flip-chip mounting method. Each of the laser array chips is optically coupled to a corresponding one of the plurality of input waveguides. The method also includes (Process 560) attaching a plurality of photodiodes, each of the plurality of photodiodes overlying a corresponding one of the plurality of gratings.

The above sequence of processes provides a method for making an integrated DWDM transmitter apparatus according to an embodiment of the invention. As shown, the method uses a combination of processes including a way of making an optical multiplexer in a silica-on-silicon substrate and mounting laser array chips on a portion of the substrate. Other alternatives can also be provided in which steps are added, one or more steps are removed, or one or more steps are provided in a different sequence without departing from the scope of the claims herein. Further details of the present method can be found throughout the present specification.

Many benefits are achieved by way of the present invention over conventional techniques. For example, in certain embodiments, the invention provides a compact, low-cost, integratable solution for monitoring individual optical power in a DWDM transmitter array integrated on a PLC platform. Some embodiments of the present invention offer a much compact, low cost solution to the monitoring of optical power in integrated active/passive optics. In specific embodiments, the light redirecting method requires no additional "real estate" on the chip and offers better/comparable performance. Various embodiments of the present invention also remove some restrictions on laser transmitters compared to monolithic integration of laser and photodiode. Thus, higher performance transmitter as well as integrated optical devices can be built using this invention.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. An integrated DWDM transmitter apparatus, the apparatus comprising:
    a silica-on-silicon substrate, the silica-on-silicon substrate including a silica layer and a silicon layer, the silica-on-silicon substrate having a recessed region;
    a plurality of input waveguides within the silica layer;
    a plurality of gratings within the silica layer, each of the plurality of gratings coupled to a corresponding one of the input waveguides;
    an arrayed waveguide grating within the silica layer and coupled to the plurality of input waveguides;
    at least an output waveguide within the silica layer and coupled to the arrayed waveguide grating;
    a plurality of lasers mounted on a surface of the recessed region of the silica-on-silicon substrate, each of the plurality of lasers being optically coupled to a corresponding one of the plurality of input waveguides; and a plurality of photodiodes, each of the plurality of photodiode overlying a corresponding one of the plurality of gratings.

2. The apparatus of claim 1 wherein each of the input waveguides within the silica layer comprises a core region surrounded by a cladding region, the core region being characterized by an index of refraction higher than an index of refraction of the cladding region.

3. The apparatus of claim 2 wherein each of the plurality of gratings is formed in a portion of the cladding region above the core region.

4. The apparatus of claim 2 wherein each of the plurality of gratings comprises a plurality of diffraction regions in the cladding region, the plurality of diffraction regions being characterized by a refractive index different from a refractive index of the cladding region.

5. The apparatus of claim 4 wherein the cladding region comprises undoped silica and the diffraction regions comprise doped silica.

6. The apparatus of claim 2 wherein each of the plurality of gratings comprises a plurality of grating elements in a portion of the cladding region, a pitch of the plurality of grating elements is selected to provide maximum diffracted power at 90 degrees relative to an axis of the core region while avoiding back reflection.

7. The apparatus of claim 6 wherein an input waveguide is characterized by DWDM wavelengths in a band between a first wavelength $\lambda_1$ and a second wavelength $\lambda_2$, and a pitch of the grating elements in each of the plurality of gratings is selected from outside the ranges between $L_1=m(\lambda_1/n)/2$ and $L_2=m(\lambda_2/n)/2$, where n is a refractive index of the waveguide and m is an integer.

8. The apparatus of claim 2 wherein the core region comprises doped silica and the cladding region comprises undoped silica.

9. The apparatus of claim 1 wherein the surface of the recessed region is a silicon surface.

10. The apparatus of claim 1 wherein the surface of the recessed region is a silica surface.

11. The apparatus of claim 1 wherein the plurality of lasers are bonded to the surface of the recessed region.

12. The apparatus of claim 1 wherein the plurality of lasers are made in InP.

13. The apparatus of claim 1 wherein the plurality of lasers are InP lasers.

* * * * *